(12) United States Patent
Manian et al.

(10) Patent No.: US 10,644,868 B2
(45) Date of Patent: May 5, 2020

(54) FREQUENCY/PHASE LOCK DETECTOR FOR CLOCK AND DATA RECOVERY CIRCUITS

(71) Applicant: TEXAS INSTRUMENTS INCORPORATED, Dallas, TX (US)

(72) Inventors: Abishek Manian, Santa Clara, CA (US); Michael Gerald Vrazel, Atlanta, GA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/128,818

(22) Filed: Sep. 12, 2018

(65) Prior Publication Data

US 2020/0084015 A1   Mar. 12, 2020

(51) Int. Cl.
| | | |
|---|---|---|
| *H04L 7/033* | (2006.01) | |
| *H03L 7/087* | (2006.01) | |
| *H03L 7/093* | (2006.01) | |
| *H03L 7/091* | (2006.01) | |
| *H03L 7/095* | (2006.01) | |

(52) U.S. Cl.
CPC .............. *H04L 7/033* (2013.01); *H03L 7/087* (2013.01); *H03L 7/091* (2013.01); *H03L 7/093* (2013.01); *H03L 7/095* (2013.01)

(58) Field of Classification Search
CPC ......... H04L 7/033; H03L 7/095; H03L 7/091; H03L 7/087; H03L 7/093

USPC ......................................................... 375/375
See application file for complete search history.

(56) References Cited

U.S. PATENT DOCUMENTS

| | | | |
|---|---|---|---|
| 7,358,784 B2 | 4/2008 | Kim et al. | |
| 7,884,674 B2 | 8/2011 | Chen et al. | |
| 8,120,407 B1* | 2/2012 | Ooi ....................... | H03K 5/135 327/147 |
| 2007/0071155 A1* | 3/2007 | Boerstler ................. | G06F 1/10 375/376 |
| 2009/0296857 A1* | 12/2009 | Kong ....................... | H03L 7/095 375/327 |
| 2013/0188762 A1 | 7/2013 | Mukherjee et al. | |

OTHER PUBLICATIONS

International Search Report in corresponding PCT Patent Application PCT/US2019/050204, dated Nov. 28, 2019 (2 pages).

* cited by examiner

*Primary Examiner* — Juan A Torres
(74) *Attorney, Agent, or Firm* — John R. Pessetto; Charles A. Brill; Frank D. Cimino (57) ABSTRACT

A circuit includes a phase and frequency detector circuit to generate a first phase detect signal indicative of whether a polarity of a first clock is the same as a polarity of a second clock upon occurrence of an edge of a data signal. The second clock being 90 degrees out of phase with respect to the first clock. A lock detect circuit determines, based on the first phase detect signal, that a third clock is one of frequency and phase locked to the data signal, frequency and quadrature locked to the data signal, and not frequency locked to the data signal.

11 Claims, 10 Drawing Sheets

FREQUENCY/PHASE LOCK DETECTOR FOR CLOCK AND DATA RECOVERY CIRCUITS

BACKGROUND

In a data communication system, data is transmitted from a transmitter to a receiver. At the receiver, the transmitted data is retrieved and consumed. Often, the clock signal used by the transmitter to transmit the data is not transmitted to the receiver. In such systems, the receiver recovers the clock using the received data signal itself and then uses the recovered clock to sample the received data signal to thereby recover the data being transmitted.

SUMMARY

In some implementations, a circuit includes a phase and frequency detector circuit to generate a first phase detect signal indicative of whether a polarity of a first clock is the same as a polarity of a second clock upon occurrence of an edge of a data signal. The second clock being 90 degrees out of phase with respect to the first clock. A lock detect circuit determines, based on the first phase detect signal, that a third clock is one of frequency and phase locked to the data signal, frequency and quadrature locked to the data signal, and not frequency locked to the data signal.

BRIEF DESCRIPTION OF THE DRAWINGS

For a detailed description of various examples, reference will now be made to the accompanying drawings in which.

DETAILED DESCRIPTION

The described examples are directed to a circuit usable to recover a clock based on a received data signal. The circuit is referred to as a clock and data recovery circuit (CDR) and the disclosed examples include circuits that represent at least a portion of a CDR. The disclosed examples determine when the recovered clock has achieved phase and frequency lock to the data signal. Responsive to the determination that phase and frequency lock has been achieved, the disclosed circuits cause power to be turned off to at least a portion of the CDR to thereby save power. In other possible implementations, the disclosed circuits may also cause power to be turned on to additional circuitry (e.g., a phase detector) within the CDR for improved performance.

Figure 1:
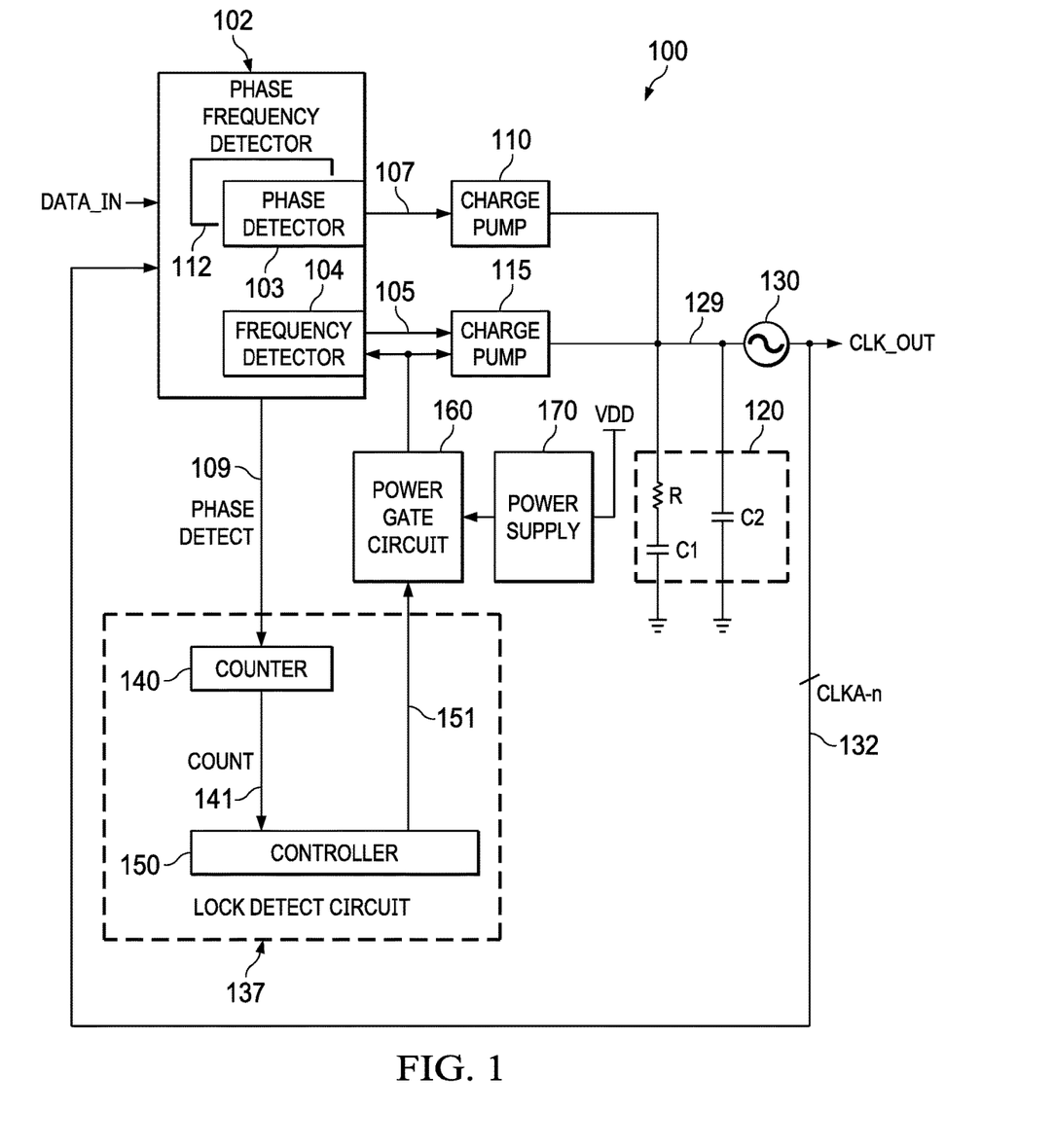
FIG. 1 illustrates a clock and data recovery circuit, or at least a portion thereof, in accordance with an example.

FIG. 1 shows an example of a CDR 100. The circuit in FIG. 1 represents at least a portion of a CDR. The example CDR 100 includes a phase and frequency detector (PFD) 102, charge pumps (CPs) 110 and 115, a loop filter 120, a voltage-controlled oscillator (VCO) 130, a counter 140, a controller 150, a power gate circuit 160, and a power supply 170. The counter 140 and controller 150 comprise, or are at least part of, a lock detect circuit 137, which performs the functionality attributed herein to the counter 140 and controller 150. An input data signal (DATA_IN) is provided to the PFD 102. DATA_IN is a signal transmitted by a transmitter to a receiver including the CDR 100. The VCO 130 (which can be other types of frequency adjustable oscillators such as a current-controlled oscillator) generates a clock signal, CLK_OUT. CLK_OUT is used, as explained below with regard to FIG. 14, to sample the state of DATA_IN to thereby recover the data transmitted by the transmitter to the receiver. The PFD 102 includes a phase detector (PD) 103 and a frequency detector (FD) 104. In this example, the PFD 102 includes another PD 112 and additional PDs can be included as well. The FD 104 generates a control signal 105 to CP 115 and PD 103 generates a control signal 107 to CP 110. Each charge pump 110, 115 comprises a current source device (e.g., a transistor) that is controlled by the respective control signal to cause a variable amount of current to loop filter 120. The example of FIG. 1 includes two charge pumps, but other examples include a single charge pump. Further still, the outputs of two charge pumps 110 and 115 of FIG. 1 are connected together but in other examples, the charge pump outputs need not be connected together. Loop filter 120 filters the varying current from the CPs 110 and 115 and produces a voltage control input 129 to the VCO 130.

The VCO 130 produces CLK_OUT at a frequency based on its control input 129. The CLK_OUT is fed back to an input of the PFD 102. In the described examples, the feedback clock 132 generated by the VCO 130, or otherwise derived from the VCO's output clock CLK_OUT, comprises multiple clocks shown in FIG. 1 as CLKA through CLKn. In the examples described herein, feedback clock 132 comprises four clocks of the same frequency but with a phase difference between each other as explained below. In the disclosed examples, CLK_OUT comprises one of the four clocks.

In the example of FIG. 1, CLK_OUT generated by the VCO 130, as well as the other clocks of the same frequency as CLK_OUT, is provided to the PFD 102. In other examples, the frequency of the VCO output clock CLK_OUT is higher than the frequency of DATA_IN and thus a frequency divider may be included in the clock feedback loop to divide down the feedback clock 132.

The loop filter 120 is a low pass filter in the example of FIG. 1 and includes resistor R and capacitors C1 and C2. The serial combination of R and C1 forms a first low pass filter and C2 functions as a ripple filter to further reduce the ripple on the voltage control input 129 to the VCO.

The power supply 170 produces one or more voltages suitable for operating the PFD 102, CPs 110, 115, counter 140, and controller 150. The power supply may include one or more direct current (DC)-to-DC converters. The power gate circuit 160 comprises one or more power transistor switches (e.g., metal oxide semiconductor field effect transistors) that are controllable by controller 150 to turn power on and off to several of the components shown in FIG. 1. For example, CP 115 and the FD 104 of the PFD 102 can be individually and selectably turned on and off by the power gate circuit 160 as specified by controller 150.

The PFD 102 generates a phase detect (PHASE DETECT) signal 109 indicative of whether a polarity of a first clock of the multi-clock feedback clock 132 is the same as a polarity of a second clock of the multi-clock feedback clock 132 upon occurrence of an edge of DATA_IN. The second clock is either 90 degrees or 180 degrees out of phase with respect to the first clock. The counter 140 represents at least a portion of the lock detect circuit 137 that generates an output signal (COUNT) 141 that is processed by the controller 150. Based on the PHASE DETECT 109, the controller determines that a third clock of the multi-clock feedback clock 132 is one of (a) frequency and phase locked to a midpoint between edge of DATA_IN (referred to as "true" phase lock), (b) frequency and quadrature locked to DATA_IN, and (c) not frequency locked to DATA_IN. If frequency lock has been achieved and/or phase lock (to the correct phase of DATA_IN) has been achieved, then at least a portion of the PFD 102 can be powered off. The controller 150 asserts a control signal 151 to the power gate circuit 160 which turns off power to the appropriate portions of the PFD 102 as explained below. The controller 150 is implemented as a finite state machine in some examples. In other examples, the controller 150 is implemented as a central processing unit (CPU) core executing machine instructions (e.g., firmware). Additionally, the controller 150 and the power gate circuit 160 may be used in conjunction to enable power to additional blocks in the CDR. For example, as shown in the example of FIG. 1, PFD 102 includes a PD 103 and a PD 112. Each of the PDs 103, 112 may be optimized for a different purpose. For example, PD 103 may be optimized to achieve a fast initial lock, while PD 112 may be optimized for jitter tolerance or some other performance metric. Once frequency and phase lock is achieved, PD 112 can be enabled while PD 103 is disabled to provide a fast-locking CDR with superior performance during certain modes of operation.

Figure 2:
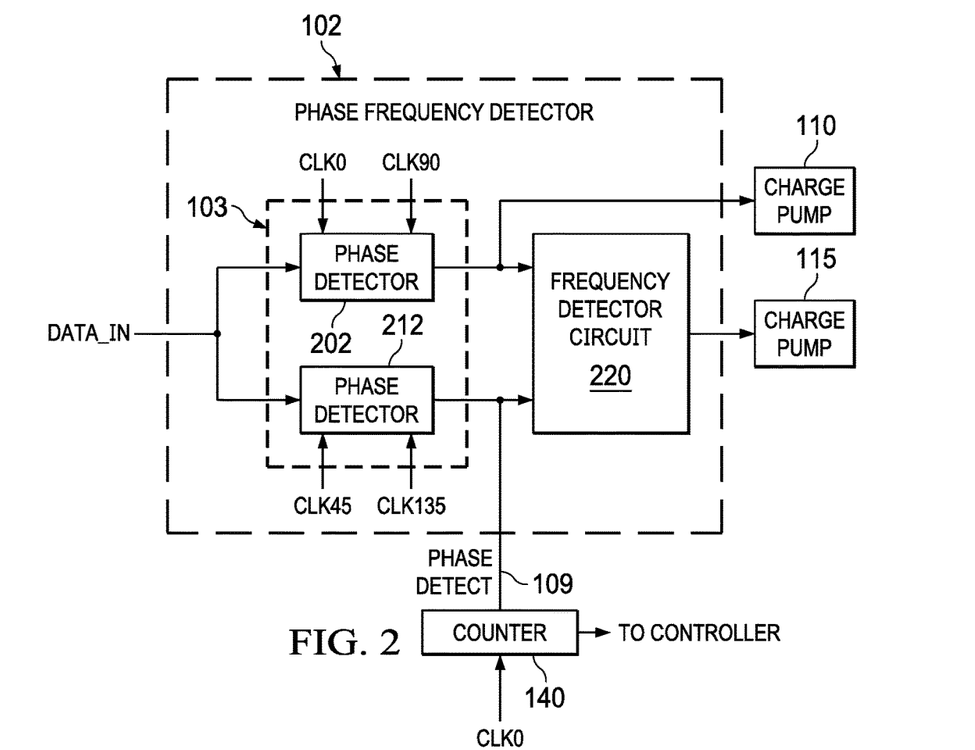
FIG. 2 illustrates a phase and frequency detector usable in the clock and data recovery circuit of FIG. 1.
Figure 13:
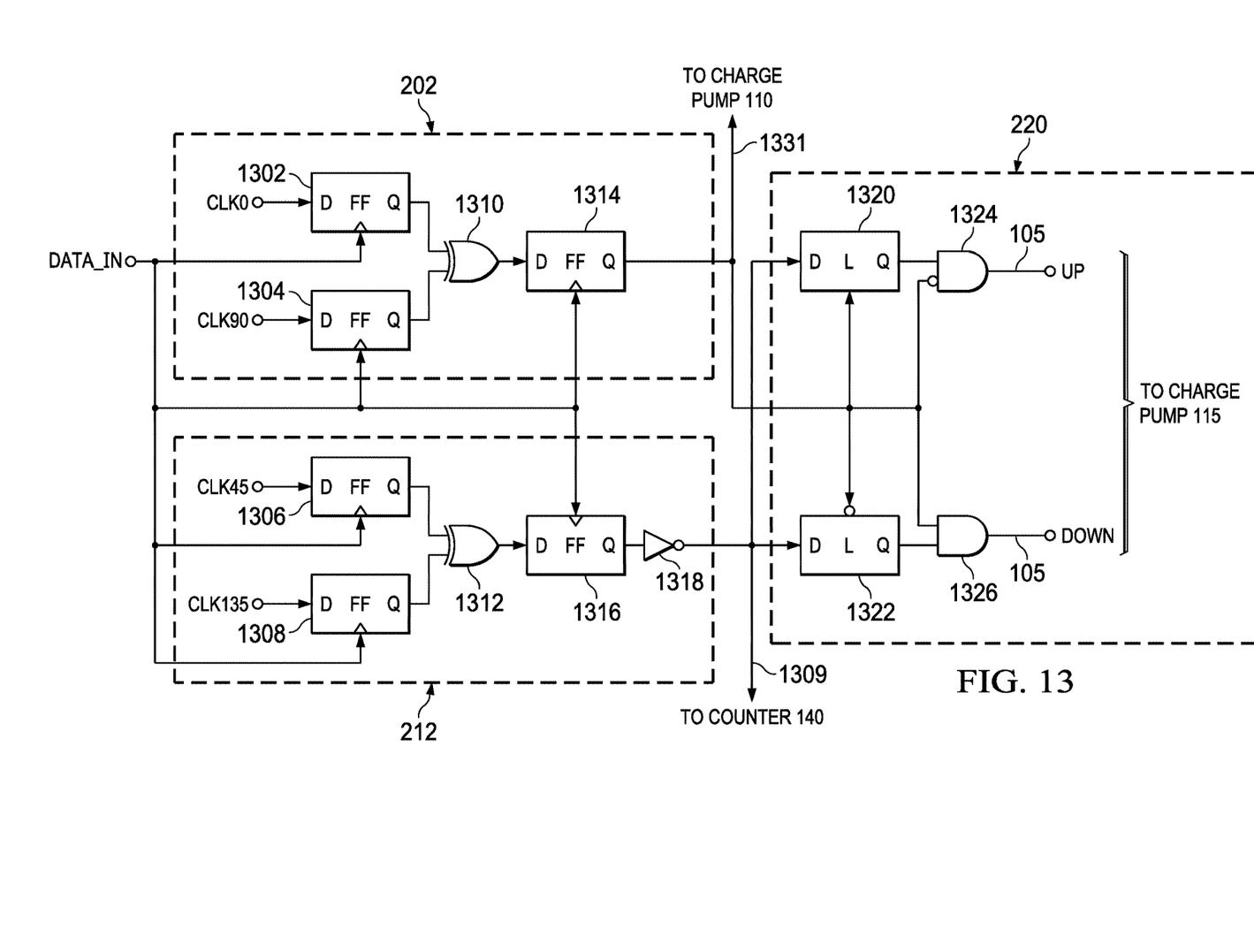
FIG. 13 shows an example of clock and data recovery circuit based on the Pottbacker frequency and phase detector.

FIG. 2 shows an example of the PFD 102 coupled to CPs 110 and 115 as well as to counter 140. In this example, the PD 103 of FIG. 1 comprises a PD 202 and a PD 212. The PFD 102 also includes an FD circuit 220 (which represents FD 104 of FIG. 1). DATA_IN is provided to both PDs 202 and 212. The outputs of both PDs 202, 212 are provided to the FD circuit 220. An example implementation of FD circuit 220 is shown in FIG. 13 and described below. The output of PD 202 is provided to and controls CP 110 and the output of FD circuit 220 is provided to and controls CP 115. The output of PD 212 comprises PHASE DETECT 109 and is provided to counter 140.

As explained above, the feedback clock 132 comprises multiple clocks CLKA-n. In the example of FIG. 2, the clocks CLKA-n comprise four clocks CLK0, CLK45, CLK90, and CLK135. All four clocks have the same frequency but are phase shifted with respect to each other. Relative to CLK0, CLK45 is shifted 45 degrees, CLK90 is shifted 90 degrees, and CLK135 is shifted 135 degrees. CLK0 and CLK90 are provided to PD 202 and CLK45 and CLK135 are provided to PD 212. Any suitable IQ filter and/or phase interpolator circuit can be used to generate the clocks.

Figure 3:
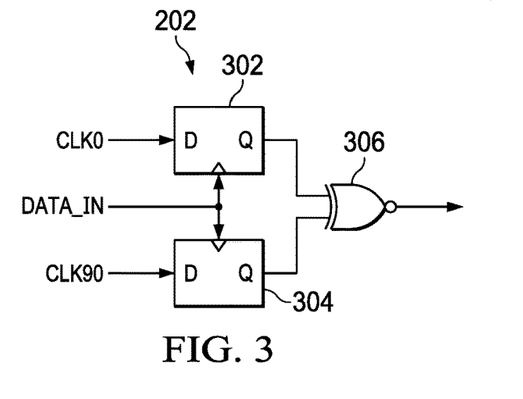
FIGS. 3 and 4 show examples of phase detectors usable in the phase and frequency detector of FIG. 3.

FIG. 3 shows an example of PD 202. In this example, PD 202 includes flip-flops 302 and 304 (e.g., D flip-flops) and a logic gate 306. The logic gate 306 in this example is an exclusive-NOR gate but could be implemented as an exclusive-OR gate or other type of logic gate. Each flip-flop 302, 304 is clocked by DATA_IN. CLK0 is provided to the data input (D) of flip-flop 302 and CLK90 is provided to the D input of flip-flop 304. Upon occurrence of an edge of DATA_IN, the state of the D input (CLK0) of flip-flop 302 is clocked through to its Q output and similarly the state of the D input (CLK90) is clocked through its respective Q output. The Q outputs thus represent the polarity state of CLK0 and CLK90 upon occurrence of the DATA_IN edge. The Q outputs are exclusive-NOR'd together by exclusive-NOR gate 306, which produces a logic 0 output if the polarity of the Q outputs from flip-flops 302, 304 differ from each other (one is a 1 and the other is a 0) or produces a logic 1 output if the polarity of the Q outputs are the same. The flip-flops 302 and 304 may be clocked by either one or both the rising and falling edges of DATA_IN. The embodiment of FIG. 3, as well as FIG. 4 described below and FIG. 2, is a half rate phase detector, which means that both edges of the recovered clock are used to sample the incoming data. In half rate phase detectors (see also FIG. 14), the clock signals have half the rate of DATA_IN. The DATA_IN data rate can be the symbol rate of the data.

Figure 4:
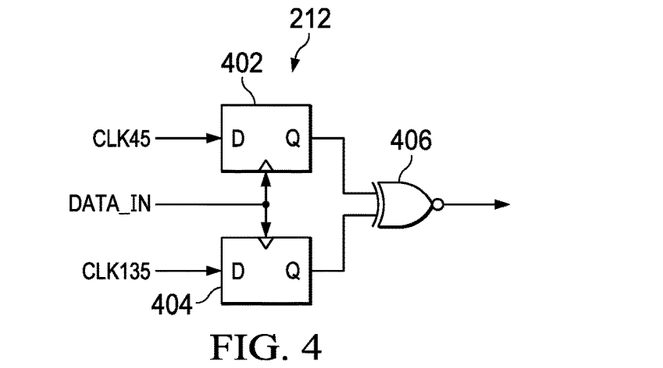

The architecture of PD 212 in FIG. 4 is the same as for PD 202 but the D inputs to the flip-flops 402 and 404 receive CLK45 and CLK135 as shown. The output of exclusive-NOR gate 406 indicates whether the polarities of CLK45 and CLK135 are the same or different upon occurrence of an edge of DATA_IN.

Figure 5:
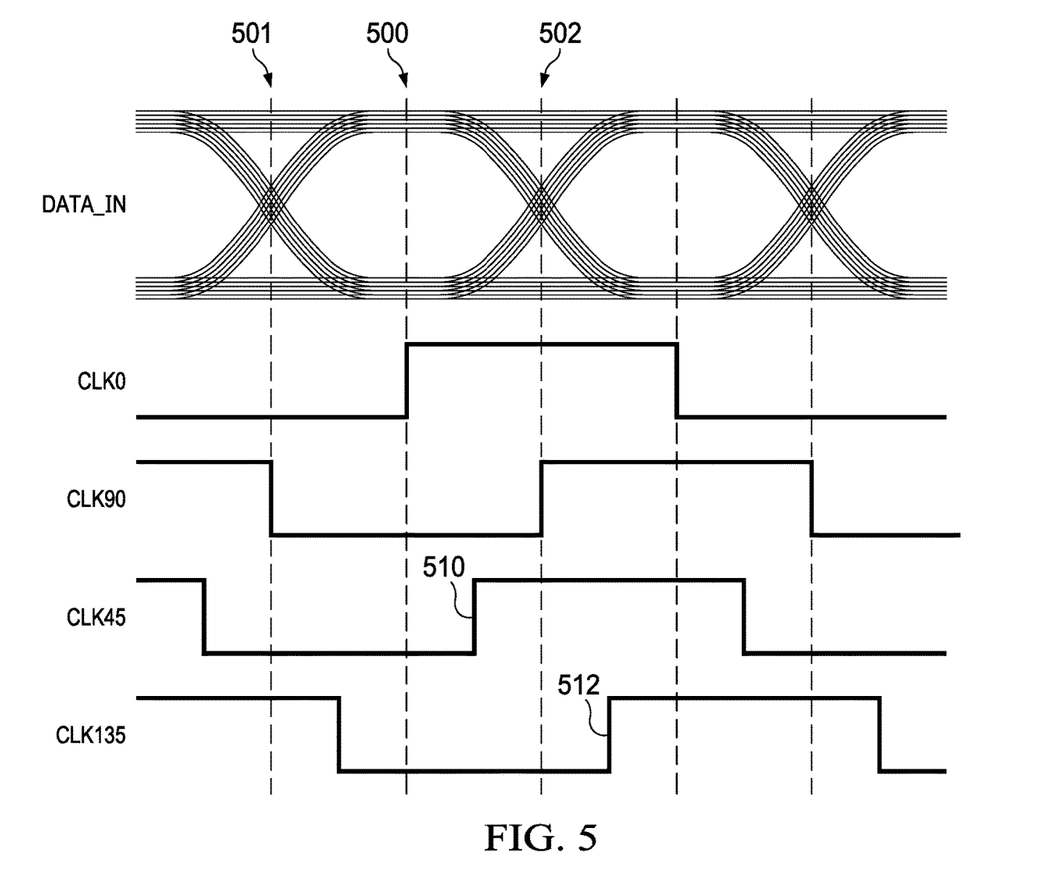
FIG. 5 shows waveforms illustrating frequency and phase lock detectable by the clock and data recovery circuits described herein.
Figure 6:
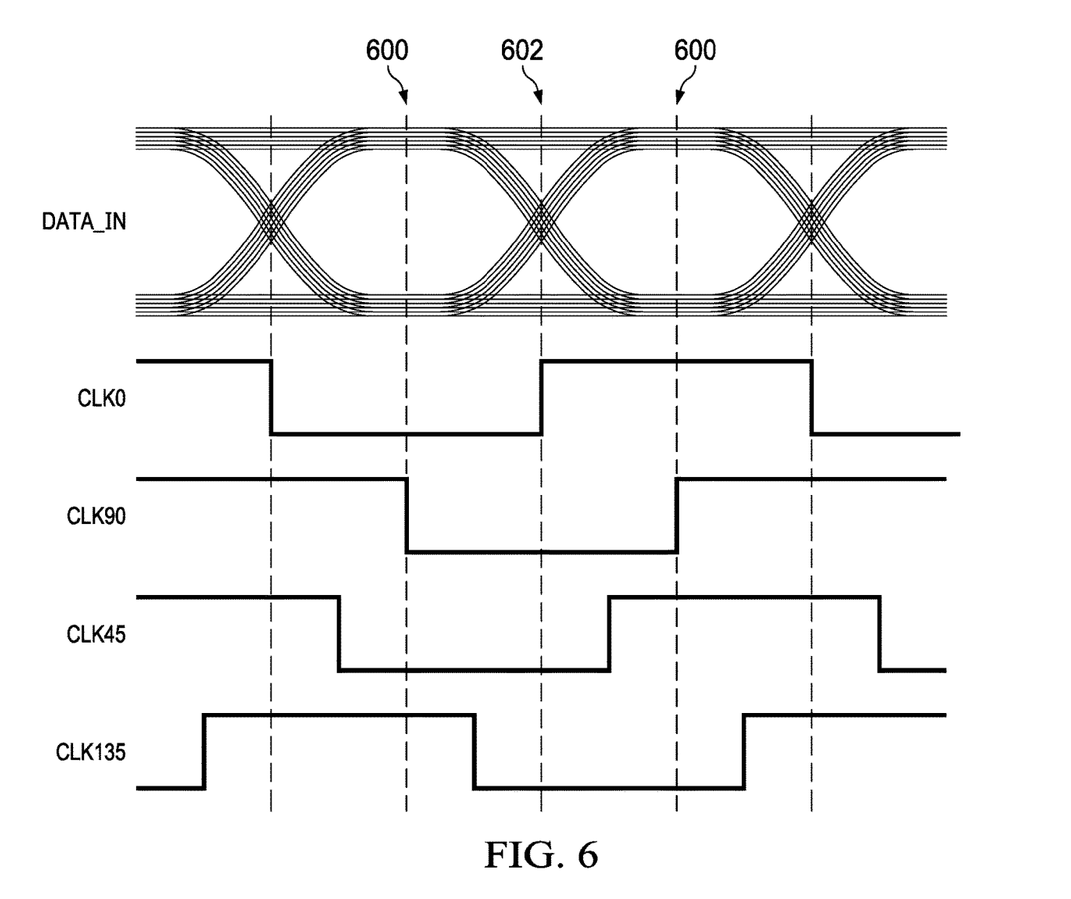
FIG. 6 shows waveforms illustrating frequency and quadrature phase lock detectable by the clock and data recovery circuits described herein.
Figure 7:
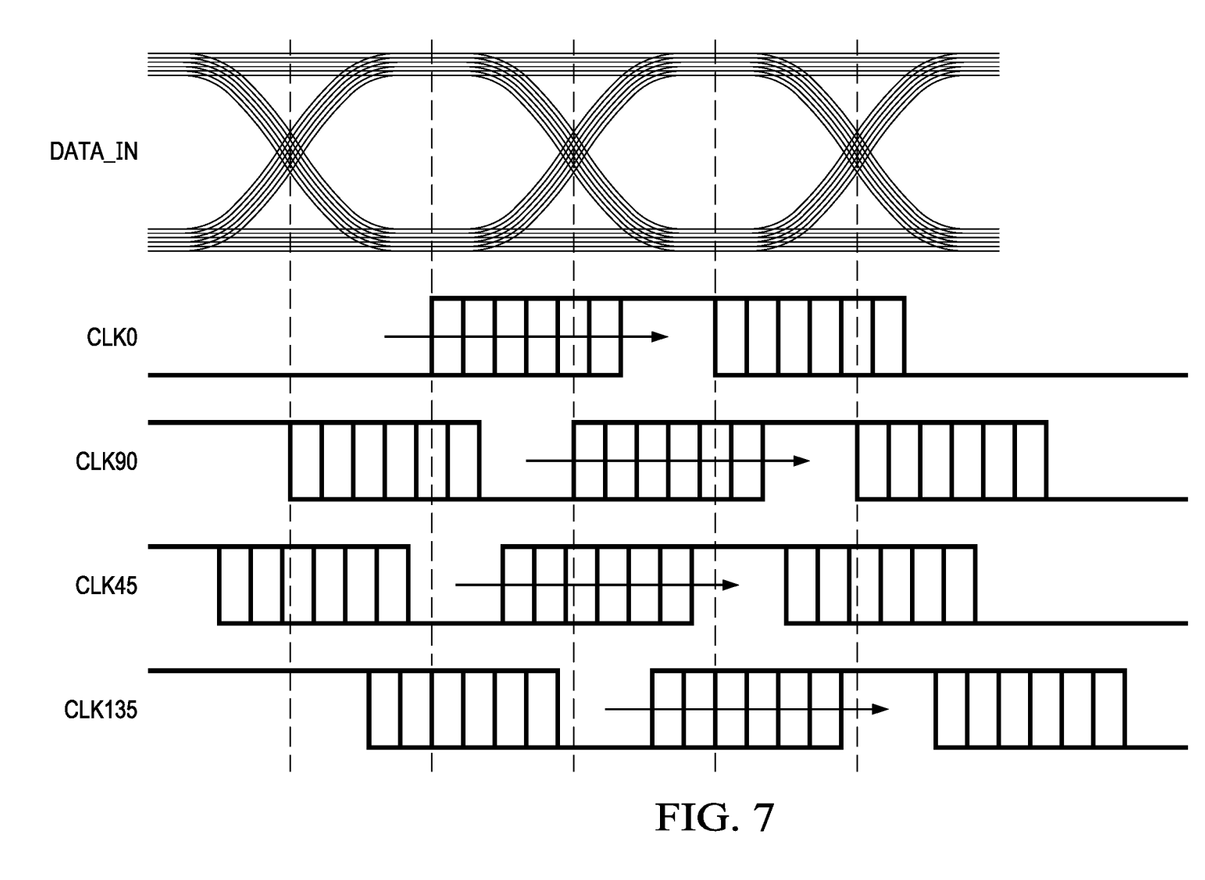
FIG. 7 shows waveforms illustrating the lack of frequency lock detectable by the clock and data recovery circuits described herein.

The usefulness of phase-shifted clocks CLK0, CLK45, CLK90, and CLK135 to detect phase and frequency lock is illustrated with respect to the timing diagrams of FIGS. 5-7. FIG. 5 illustrates the case in which CLK0 is frequency and phase locked to approximately the midpoint 500 between DATA_IN edges (e.g., edges 501 and 502) (true phase lock), which is desirable so as to accurately sample DATA_IN. Being shifted 90 degrees means that CLK90 is phase aligned to the DATA_IN edges. Edges 510 and 512 of CLK45 and CLK135 are offset from DATA_IN edge 502 with edge 510 of CLK45 leading data edge 502 and edge 512 of CLK135 lagging edge 502. At the edges of DATA_IN, the polarity of CLK45 is opposite that of the polarity of CLK135. For example, with respect to edge 502, CLK45 is high and CLK135 is low as shown.

At the edges (e.g., edge 502) of DATA_IN, flip-flops 402 and 404 of PD 212 will latch through the state of CLK45 and CLK135 and the output of exclusive-NOR gate 406 will be a logic 0 because the polarities of CLK45 and CLK135 are opposite one another. Thus, assuming frequency lock is present and that CLK0 is locked to the midpoint 500, the output of PD 212 will always, or at least mostly, produce a signal (0 in the example of logic gate 406 being an exclusive-NOR gate) that indicates CLK45 and CLK135 are of opposite polarity for each DATA_IN edge.

For PD 202, the output of exclusive-NOR gate 306 will sometimes be a 0 sometimes a 1 because CLK90 is edge aligned to the edges of DATA_IN. As such, sometimes flip-flop 304 will latch in a 0 for CLK90 and sometimes a 1 depending on the amount of jitter present in CLK90.

FIG. 6 illustrates the case in which CLK0 is frequency locked to DATA_IN, but quadrature phase locked, meaning that CLK0 is phase locked to the edges 602 of DATA_IN, not the midpoints 600. CLK45 and CLK135 have the same polarity at each edge 602 of DATA_IN, as opposed to an opposite polarity as is the case for phase and frequency lock in FIG. 5. As such, the output of exclusive-NOR gate 406 will always, or mostly, be a logic 1. Further, because CLK0 is phase aligned to edges 602, flip-flop 302 will sometimes latch a 0 for CLK0 and sometimes a 1 depending on the jitter present in CLK0.

PD 202 cannot distinguish between the frequency and phase lock condition illustrated in FIG. 5 and the frequency and quadrature lock condition illustrated in FIG. 6. However, PD 212 can distinguish between these two conditions. References herein to frequency and phase lock (to the midpoint of DATA_IN) refers to the determination that the polarities of CLK45 and CLK135 are frequently (per a threshold) of opposite polarities when sampled by an edge of DATA_IN. Similarly, references herein to frequency and quadrature lock (or just quadrature lock) refers to the determination that the polarities of CLK45 and CLK135 are frequently (per a threshold) of the same polarities when sampled by an edge of DATA_IN.

FIG. 7 illustrates the case in which CLK0 is not frequency locked to DATA_IN. As such, the edges of CLK0, CLK45, CLK90, and CLK135 occur at different times during each period of DATA_IN as indicated by the arrows in FIG. 7. The output of PD 202 will sometimes be a 0 and sometimes a 1. Similarly, the output of PD 212 will sometimes be a 0 and sometimes a 1.

For frequency and phase lock of FIG. 5, PD 212 will always or mostly produce a signal of a particular polarity (e.g., 0). For frequency and quadrature lock of FIG. 6, PD 212 also will always or mostly produce a signal of a particular polarity but of a different polarity than for FIG. 5 (e.g., 1). For the case of no frequency lock, PD 212 will produce logic 1's approximately half the time and logic 0's half the time. As such, the output of PD 212 can be used to detect the three conditions illustrated in FIGS. 5-7. If both frequency and true phase lock (to the midpoints of DATA_IN) is detected, then the controller 150 can cause power to be disabled to the FD circuit 220 as well as to PD 212 as those circuits are no longer needed. If frequency and quadrature lock is detected, the controller 150 is configured to cause power to the FD circuit 220 to be disabled, but maintain power to PD 212 and reset counter 140 (discussed below) to permit the circuit to continue to detect true phase lock. If frequency lock is not detected, then power is maintained to the FD circuit and PD 212.

Figure 8:
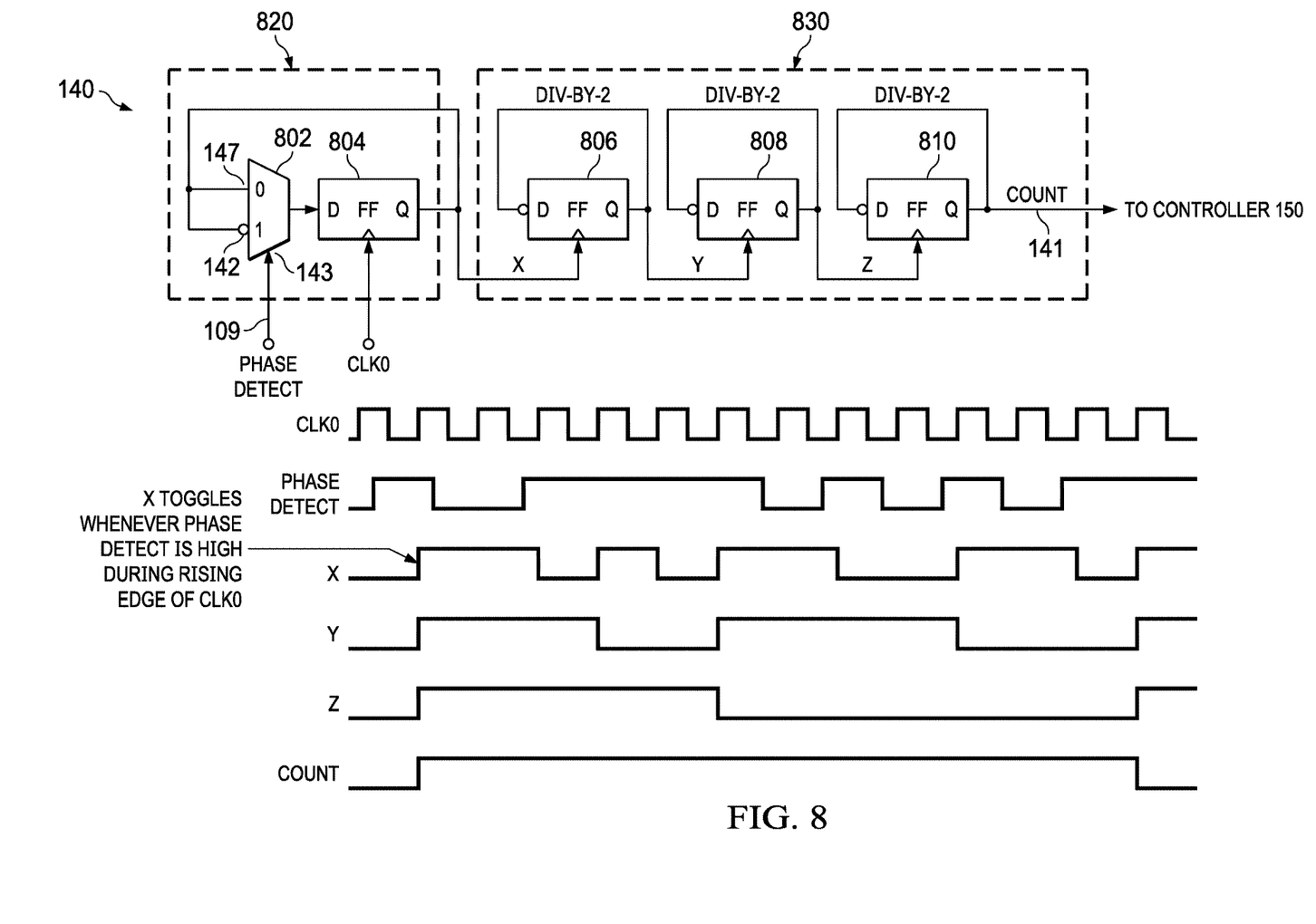
FIG. 8 shows an example of a counter and associated waveforms pertaining to a frequency/phase lock detector for the clock and data recovery circuit of FIG. 1.

FIG. 8 shows an example of an implementation of counter 140. In this example, counter 140 comprises a multiplexer 802 and flip-flops 804, 806, 808, and 810 (e.g., D flip-flops). The Q output of flip-flop 804 is provided back to a first input 147 (labeled as "O") and a second input of multiplexer 802. Multiplexer input 142 (labeled as "1") is an inverted input which inverts the signal from the Q output of flip-flop 804. Multiplexer input 147 is not inverted. The control input 143 receives PHASE DETECT 109 generated by PD 212 to control which of the flip-flop 804 Q output or the inverse of the Q output is provided as an output from the multiplexer 802 to the D input of flip-flop 804. Flip-flop 804 is clocked by CLK0 (but could be any of CLK0, CLK45, CLK90, or CLK135).

The Q output of flip-flop 804 (labeled as signal "X") toggles whenever PHASE DETECT 109 being high during a rising edge of CLK0. As such, X toggles whenever PHASE DETECT 109 is sampled high by CLK0. As explained above, PHASE DETECT 109 being high means that CLK45 and CLK135 were of the same polarity (FIG. 6) and PHASE DETECT 109 being high for extended periods of time is indicative of CLK0 being in frequency lock but quadrature lock with respect to DATA_IN. X does not toggle whenever PHASE DETECT 109 is sampled low by CLK0. As explained above, PHASE DETECT 109 being low means that CLK45 and CLK135 were of opposite polarity (FIG. 5) and PHASE DETECT 109 being low for extended periods of time is indicative of CLK0 being in frequency and phase lock with respect to the midpoint of DATA_IN. If frequency lock is not achieved (FIG. 7), signal X will toggle less often than if frequency and quadrature lock is achieved but more frequently than if frequency and phase lock (to the midpoint of DATA_IN) is achieved. The combination of multiplexer 802 and flip-flop 804 is a toggle flip-flop.

Flip-flops 806, 808, and 810 are configured as a ripple counter. The X signal from flip-flop 804 is used to clock flip-flop 806. The Q output of flip-flop 806 (signal "Y") is used to clock flip-flop 808 and the Q output of flip-flop 808 (signal "Z") is used to clock flip-flop 810. The Q output of flip-flop 810 is the COUNT signal 141. While a three flip-flop ripple counter is shown in FIG. 8, any number of flip-flops can be used to implement the ripple counter. The D inputs to flip-flops 806, 808, and 810 are inverted and the Q outputs of each flip-flop is provided back to their respective inverted D inputs as shown. Illustrative waveforms for CLK0, PHASE DETECT 109, X, Y, Z, and COUNT are shown in FIG. 8. Y changes state (toggles) upon an occurrence of a rising edge of X. Similarly, Z toggles each upon an occurrence of a rising edge of Y, and COUNT 141 toggles each upon an occurrence of a rising edge of Z. COUNT 141 thus is indicative of the frequency with which PHASE DETECT 109 is high or low upon a rising edge of CLK0. In the example of FIG. 1, COUNT 141 is provided to the controller 150 which counts rising or falling edges of COUNT 141 asynchronously for a fixed period of time and then compares the resulting count value to a pair of thresholds as shown in FIG. 9.

Figure 9:
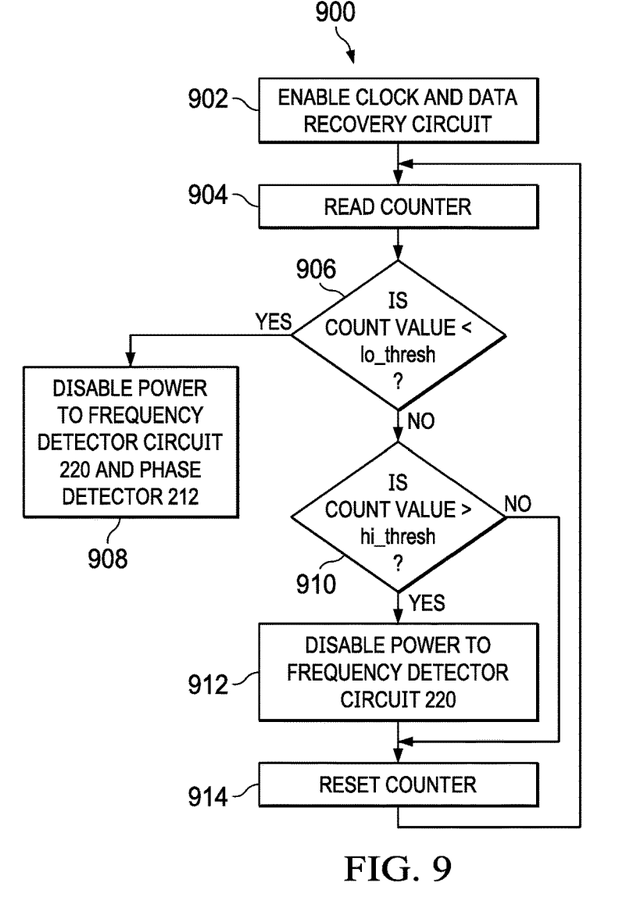
FIG. 9 shows a flow chart for controlling the power state of the clock and data recovery circuits described herein based on the lock status of the circuits.

FIG. 9 includes a flow chart 900 illustrating the operation of CDR 100. At 902, the CDR 100 is enabled (e.g., powered on). At 904, the controller 150 reads the count value (CNT). In some embodiments, the controller 150 receives the COUNT signal 141 from the counter 140 and counts the number of edges of COUNT (e.g., number of rising edges, number of falling edges, or number of both rising and falling edges) to generate CNT, store it in register or memory, and read it back. At 906, the controller determines whether CNT is less than a lower threshold (lo_thresh). If CNT is less than lo_thresh (indicative of frequency and phase lock (to the midpoint of DATA_IN), then at 908, the controller 150 asserts a signal to the power gate circuit 160 (FIG. 1) to disable power to the FD circuit 220 as well as to PD 212.

If CNT is not less than lo_thresh, then the controller 150 determines at 910 whether CNT is greater than a higher threshold (hi_thresh), which would indicate that frequency lock and quadrature lock are present. If CNT is indeed greater than hi_thresh, then at 912, the controller 150 asserts a signal to the power gate circuit 160 to cause only the FD circuit 220 to be disable. The counter 140 is then reset at 914 (e.g., by asserting a signal to a reset input of each of the flip-flops in FIG. 8). Also, if CNT is not greater than hi_thresh (meaning that CNT is between lo_thresh and hi_thresh), then frequency lock has not been achieved, and the counter is reset at 914 and the process continues.

Figure 10:
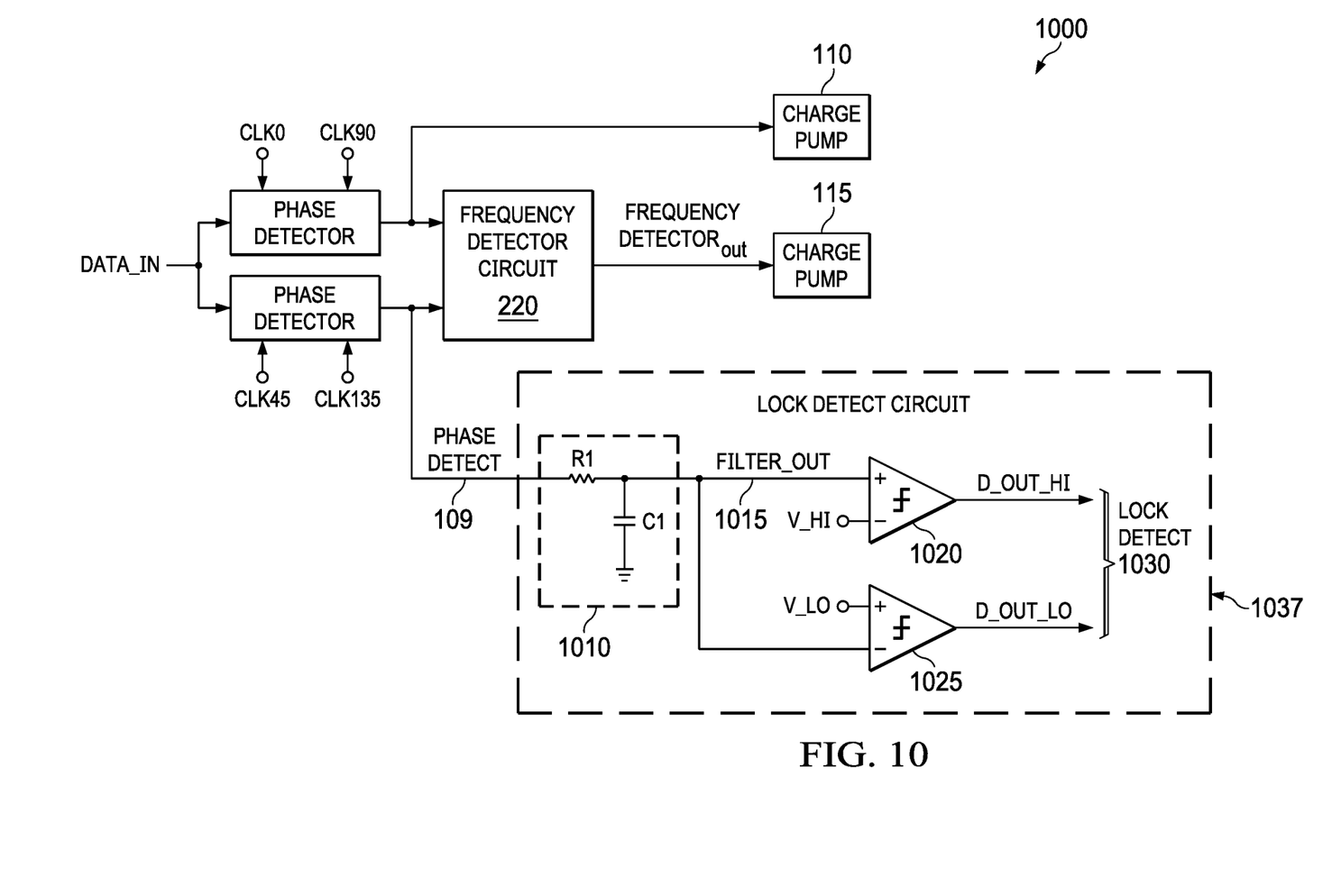
FIG. 10 shows an example clock and data recovery circuit including a filter and comparators.

FIG. 10 shows an example of an implementation of CDR 1000 that includes a filter 1010 and comparators 1020 and 1025 instead of a counter (e.g., counter 140). The filter 1010 and comparators 1020, 1025 comprise another example of a lock detect circuit 1037. The controller 150 may also be part of the lock detect circuit 1037. The filter 1010 includes resistor R1 coupled to capacitor C1. Filter 1010 is a low pass filter that low pass filters PHASE DETECT 109 to recover the direct current (DC) component of PHASE DETECT as filter output signal 1015 (FILTER_OUT). FILTER_OUT 1015 is provided to a positive input (+) of comparator 1020 and to a negative input (−) of comparator 1025. The negative input of comparator 1020 is coupled to an upper threshold voltage (V_HI) and the positive input of comparator 1025 is coupled to a lower threshold voltage (V_LO).

The magnitude of FILTER_OUT is a function of how long PHASE DETECT 109 is high versus low. The comparators 1020 and 1025 along with the threshold voltages V_HI and VLO establish three regions with respect to V_HI and V_LO. If PHASE DETECT 109 is greater than V_HI (which is indicative of frequency and quadrature lock), then the output (D_OUT_HI) of comparator 1020 will be logic high and the output (D_OUT_LO) of comparator 1025 will be logic low. If PHASE DETECT 109 is between V_HI and V_LO (which is indicative of lack of frequency lock), then both D_OUT_HI and D_OUT_LO will be logic low. If PHASE DETECT 109 is less than V_LO (which is indicative of frequency and phase lock to the midpoint of DATA_IN), then D_OUT_HI will be logic low and D_OUT_LO will be logic high. The controller 150 receives D_OUT_HI and D_OUT_LO and responds to the state of these signals to modify the power state of CDR 100 as explained previously. LOCK DETECT 1030 includes D_OUT_HI and D_OUT_LO.

Figure 11:
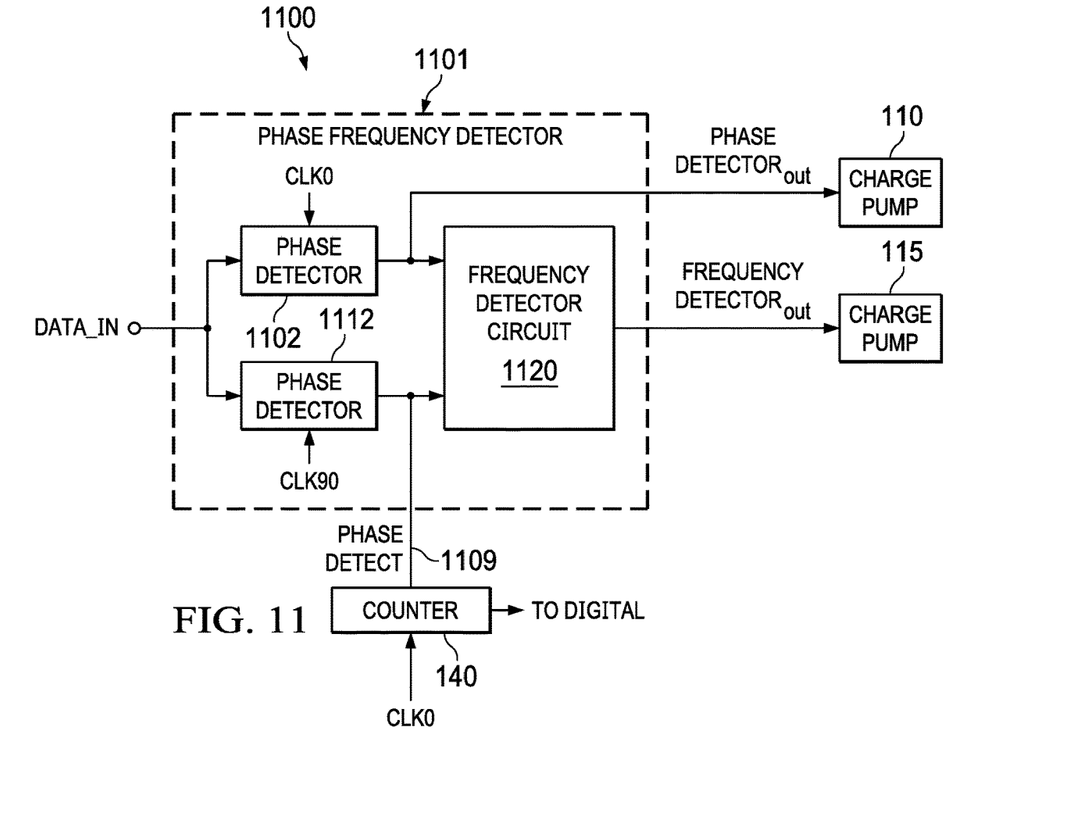
FIG. 11 shows an example of a full rate clock and data recovery circuit.
Figure 12:
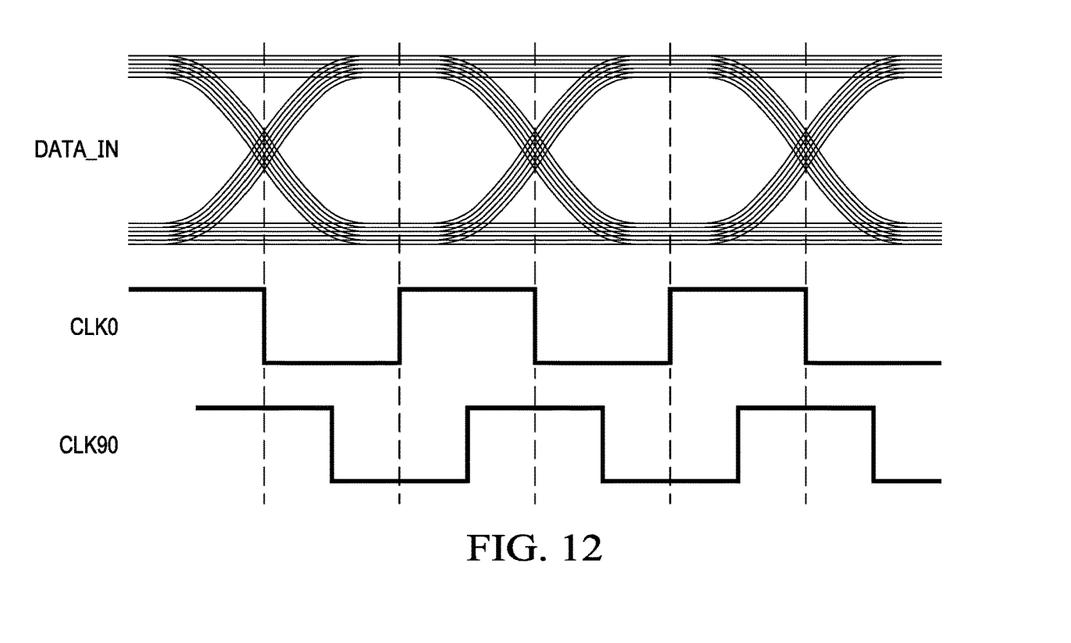
FIG. 12 illustrates waveforms pertaining to the full rate clock and data recovery circuit of FIG. 11.

FIG. 11 illustrates an embodiment of a full rate CDR 1100. The full rate CDR 1100 uses clock signals whose frequencies equal the data rate of DATA_IN and only the rising edges of the recovered clock are used to sample DATA_IN. In this example, PD 1102 receives CLK0 and PD 1112 receives CLK90. The output signal 1109 from PD 1112 is provided to counter 140 (or to a filter and comparators as in FIG. 10). PHASE FREQUENCY DETECTOR 1101 includes PHASE DETECTOR 1102, PHASE DETECTOR 1112, and FREQUENCY DETECTOR CIRCUIT 1120. FIG. 12 shows an example of the data and clock waveforms for frequency and phase lock.

Frequency and true phase lock (to the midpoint of DATA_IN) is detected when PD 1112 always or mostly produces a 1 because during true phase lock CLK90 is a 1 at the edge of DATA_IN. Frequency and quadrature phase lock is detected when PD 1112 always or mostly produces a 0 because during quadrature lock, CLK90 is a 0 at the edge of DATA_IN. When not in frequency lock, PD 1112 produces a 1 approximately half the time and a 0 approximately half the time. PD 1102 in FIG. 11 can be implemented as a single flip-flop for which CLK0 is provided to the D input and which uses DATA_IN to clock the flip-flop. Similarly, PD 1112 can be implemented as a single flip-flop for which CLK90 is provided to the D input and which uses DATA_IN to clock the flip-flop.

FIG. 13 shows an implementation of a phase and frequency detector. The phase and frequency detector of FIG. 13 is based on the architecture of a rotational phase and frequency detector. Phase and frequency detector includes flip-flops 1302, 1304, 1306, 1308, 1314, 1316, latches 1320 and 1322, exclusive-OR gates 1310 and 1312, AND gates 1324 and 1326. DATA_IN is used to clock flip-flops 1302-1308, 1314 and 1316. The combination of flip-flops 1302, 1302 and 1314 and XOR gate 1310 comprise PD 202. The combination of flip-flops 1306, 1308 and 1316, XOR gate 1312, and inverter 1318 comprise PD 212. The combination of flip-flops 1320 and 1322 and AND gates 1324 and 1326 comprise FD circuit 220. CLK0 is provided to the D input of flip 1302. CLK90 is provided to the D input of flip 1304. CLK45 is provided to the D input of flip 1306. CLK135 is provided to the D input of flip 1308. The Q outputs of flip-flops 1302 and 1304 are exclusive-OR together by exclusive-OR gate 1310. The Q outputs of flip-flops 1306 and 1308 are exclusive-OR together by exclusive-OR gate 1312. Flip-flop 1314 latches the output of exclusive-OR gate 1310 to its Q output. Flip-flop 1316 latches the output of exclusive-OR gate 1312 to its Q output. The outputs of the two flip-flops 1314 and 1316 (and the output of flip-flop 1316 through inverter 1318) are provided to the FD circuit 220 to generate the frequency detector output control signal 105. In this example, control signal 105 comprises an up (UP) signal and a down (DN) signal, which are provided to the charge pump 115. The output signal 1331 from flip-flop 1314 is the output of the PD 202, and is provided to the charge pump 110. The output signal 1309 from PD 212 is provided to counter 140 (or to a filter and comparators as in FIG. 10). In some implementations, DATA_IN can be encoded according to non-return-zero encoding (NRZ) or according to pulse amplitude modulation-4 (PAM4) encoding. For PAM4 data, in some implementations the received data to the receiver is passed through a limiting amplifier to convert the PMA4 data into NRZ-like data before then providing the data to the PFD 102. For example, assuming PAM4 data has four levels, +3V, +1V, −1V and −3V, the limiting amplifier would output 1 for the +3V and +1V levels and 0 for −1V and −3V levels, i.e. the limiting amplifiers acts as an unclocked comparator with threshold of 0V.

Figure 14:
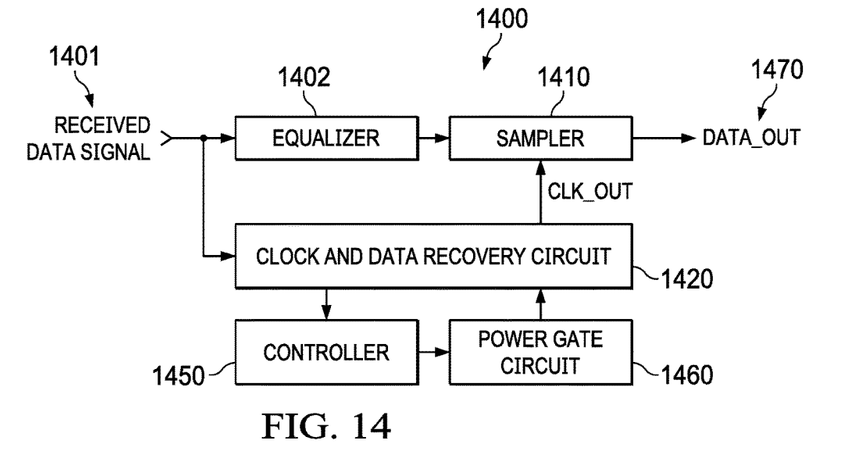
FIG. 14 illustrates a receiver in which any of the clock and data recovery circuits described herein can be used.

FIG. 14 shows an example of at least portion of a receiver 1400. The receiver 1400 includes an equalizer 1402, a sampler 1410, a CDR 1420, a controller 1450 and a power gate circuit 1460. CDR 1420, controller 1450 and power gate circuit 1460 can be implemented using, for example, any of the implementations described herein. In some implementations, the equalizer 1402 includes a linear equalizer to process the received data signal 1401 with a linear filter. The CDR 1420 also receives the received data signal 1401 (DATA_IN as used above) and generates CLK_OUT signal to the sampler 1410. The CLK_OUT signal is the clock signal recovered based on the received data signal 1401. CLK_OUT generated by the CDR 1420 is used to sample the output of the equalizer to produce a data output (DATA_OUT) signal 1470 for consumption by other components in, or coupled to, the receiver 1400. The power gate circuit 1460 disables power to certain components and enables power to certain other components of the CDR 1420 as explained previously under control by controller 1450.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
   a phase and frequency detector circuit to generate a first phase detect signal indicative of whether a polarity of a first clock is the same as a polarity of a second clock upon occurrence of an edge of a data signal, the second clock being 90 degrees out of phase with respect to the first clock; and a lock detect circuit to determine, based on the first phase detect signal, that a third clock is one of frequency and phase locked to the data signal, frequency and quadrature locked to the data signal, and not frequency locked to the data signal.

2. The circuit of claim 1, further comprising a power gate circuit to, based on a signal from the lock detect circuit:
disable power to at least a first portion of the phase and frequency detector circuit; and
enable power to at least a second portion of the phase and frequency detector circuit.

3. The circuit of claim 1, further comprising a power gate circuit to disable, based on a signal from the lock detect circuit, power to at least portion of the phase and frequency detector circuit.

4. The circuit of claim 1, wherein the lock detect circuit comprises a counter to count the first phase detect signal.

5. The circuit of claim 1, wherein the lock detect circuit comprises a filter and a comparator.

6. The circuit of claim 1, wherein the lock detect circuit comprises a low pass filter and a plurality of comparators.

7. The circuit of claim 2, wherein:
the first phase detector comprises:
a first flip-flop including a first data input and a first output;
a second flip-flop including a second data input and a second output; and
a first logic gate that is coupled to receive the first and second outputs; and
the second phase detector comprises:

a third flip-flop including a third data input and a third output;
a fourth flip-flop including a fourth data input and a fourth output; and
a second logic gate that is coupled to receive the third and fourth outputs.

8. The circuit of claim 3, wherein the phase and frequency detector circuit comprises a first phase detector, a second phase detector and a frequency detector circuit, and the power gate circuit to disable power to the frequency detector upon a determination that frequency lock is achieved.

9. The circuit of claim 3, wherein the phase and frequency detector circuit comprises a first phase detector, a second phase detector and a frequency detector circuit, and the power gate circuit to disable power to the frequency detector and to one of the phase detectors upon a determination that frequency and phase lock is achieved.

10. The circuit of claim 4, wherein a count value derived from the counter is usable to determine that the third clock is one of frequency and phase locked to the data signal, frequency and quadrature locked to the data signal, and not frequency locked to the data signal.

11. The circuit of claim 7, wherein:
each of the first, second, third and fourth flip-flops have a clock input coupled to receive the data signal;
the first data input coupled to receive the first clock;
the second data input coupled to receive the second clock;
the third data input coupled to receive a third clock;
the fourth data input coupled to receive a fourth clock, the third clock being 90 degrees out of phase with respect to the fourth clock.

* * * * *